United States Patent
Kim et al.

(10) Patent No.: US 6,867,082 B2
(45) Date of Patent: Mar. 15, 2005

(54) NONVOLATILE MEMORY CELLS HAVING SPLIT GATE STRUCTURE AND METHODS OF FABRICATING THE SAME

(75) Inventors: Jin-Woo Kim, Suwon (KR); Dong-Jun Kim, Suwon (KR); Min-Soo Cho, Seongnam (KR); Dai-Geun Kim, Yongin (KR)

(73) Assignee: Samsung Electronics Co., LTD, Seoul (KR)

( * ) Notice: Subject to any disclaimer, the term of this patent is extended or adjusted under 35 U.S.C. 154(b) by 0 days.

(21) Appl. No.: 10/844,240

(22) Filed: May 12, 2004

(65) Prior Publication Data

US 2004/0207005 A1 Oct. 21, 2004

Related U.S. Application Data

(62) Division of application No. 10/401,666, filed on Mar. 28, 2003, now Pat. No. 6,753,571.

(30) Foreign Application Priority Data

Mar. 28, 2002 (KR) .......................................... 2002-17090

(51) Int. Cl.[7] .......................................... H01L 21/8238
(52) U.S. Cl. ........................ 438/201; 438/201; 438/230
(58) Field of Search .................................. 438/201, 207, 438/211, 217, 214, 224, 230, 228

(56) References Cited

U.S. PATENT DOCUMENTS 6,228,695 B1 * 5/2001 Hsieh et al. ................ 438/201
6,249,022 B1 * 6/2001 Lin et al. .................... 257/324

* cited by examiner

Primary Examiner—David Nelms
Assistant Examiner—Thinh T Nguyen
(74) Attorney, Agent, or Firm—F. Chau & Associates, LLC

(57) ABSTRACT

Nonvolatile memory cells having a split gate structure and methods of fabricating the same are provided. The nonvolatile memory cells include active regions defined at a predetermined region of a semiconductor substrate. A portion of each of the active regions is etched to form a cell trench region. Insulated floating gates are disposed on a pair of sidewalls parallel with the direction that crosses the active region. A source region is disposed at a bottom surface of the cell trench region. A gap region between the floating gates is filled with a common source line electrically connected to the source region. The common source line is extended along the direction that crosses the active regions. The active regions, which are adjacent to the floating gates, are covered with word lines parallel with the common source line. Drain regions are disposed in the active regions adjacent to the word lines. The drain regions are electrically connected to bit lines that cross over the word lines.

10 Claims, 16 Drawing Sheets

NONVOLATILE MEMORY CELLS HAVING SPLIT GATE STRUCTURE AND METHODS OF FABRICATING THE SAME

CROSS-REFERENCE TO RELATED APPLICATION

This application is a divisional of U.S. application Ser. No. 10/401,666 filed on Mar. 28, 2003, now U.S. Pat. No. 6,753,571 the disclosure of which is incorporated herein by reference in its entirety.

This application claims priority to Korean Patent Application No. 2002-17090, filed on Mar. 28, 2002, the contents of which are herein incorporated by reference in their entirety.

BACKGROUND OF THE INVENTION

1. Field of the Invention

The present invention relates, generally, to semiconductor devices and methods of fabricating the same. More specifically, the present invention is directed to nonvolatile memory cells having a split gate structure and methods of fabricating nonvolatile memory cells having a split gate structure.

2. Discussion of Related Art

Semiconductor memory devices for storing data can be typically categorized as either volatile memory devices or nonvolatile memory devices. Volatile memory devices lose their stored data when their power supply is interrupted, and nonvolatile memory devices retain their stored data even when their power supply is interrupted. Accordingly, the nonvolatile memory devices have been widely used in memory cards, mobile telecommunication systems or the like.

The nonvolatile memory devices may have either stacked gate structural cells or split gate structural cells. The split gate structural cells require less power for program operation or erase operation then stacked gate structural cells.

FIG. 1 is a top plan view of a conventional split gate structural cell. FIGS. 2A, 3, 4, 5A, and 6A are cross-sectional views taken along the line I—I of FIG. 1, and FIGS. 3B, 5B, and 6B are cross-sectional views taken along the line II—II of FIG. 1.

Referring to FIGS. 1, 2A, and 2B, a tunnel oxide layer 3 and a floating gate layer 5 are sequentially formed on a semiconductor substrate 1. The floating gate layer 5 is formed of a doped polysilicon layer. The floating gate layer 5, the tunnel oxide layer 3, and the semiconductor substrate 1 are patterned to form a trench region defining an active region 7a at a predetermined region of the semiconductor substrate 1. As a result, the active region 7a is covered with the tunnel oxide layer 3 and the floating gate layer 5. A nitride layer pattern 9 is formed on the semiconductor substrate having the device isolation layer 7. The nitride layer pattern 9 has an opening 9a crossing the active region.

Referring to FIGS. 1 and 3, oxide layer spacers 11 are formed on sidewalls of the opening 9a. The floating gate layer 5 exposed in the opening 9a is etched using the oxide layer spacers 11 and the nitride layer pattern 9 as etch masks, to expose the tunnel oxide layer 3 formed on the active region 7a. Impurity ions are then selectively implanted into a surface of the semiconductor substrate under the exposed tunnel oxide layer 3, thereby forming a source region 13.

Referring to FIGS. 1 and 4, the semiconductor substrate having the source region 13 is thermally oxidized to form a sidewall oxide layer on sidewalls of the patterned floating gate layer 5. The sidewall oxide layer (not shown) and the tunnel oxide layer 3 are successively etched using an anisotropic etch process to expose the source region 13 and to simultaneously leave a sidewall oxide layer pattern 15 covering the sidewall of the patterned floating gate layer 5. A doped polysilicon layer is formed on an entire surface of the semiconductor substrate, the sidewall oxide layer pattern 15, and filling the void left from the anisotropic etch. The doped polysilicon layer is etched back until a top surface of the nitride layer pattern 9 is exposed, thereby forming a common source line 17 crossing the active region 7a on the exposed source region 13.

Referring to FIGS. 1, 5A, and 5B, the exposed nitride layer pattern 9, as shown in FIG. 4, is selectively removed to expose the floating gate layer 5 thereunder. Thereafter, the exposed floating gate layer 5 and the tunnel oxide layer 3 are successively etched using the spacers 11 as etch masks, to expose the active region. As a result, as illustrated in FIG. 5A, floating gates 5a are formed between the spacers 11 and the active region 7a. Here, in the event that the floating gate layer 5 and the common source line 17 are formed of a polysilicon layer, the common source line 17 may be also etched while etching the floating gate layer 5. Therefore, a thickness of the floating gate layer 5 should be reduced in order to prevent the common source line 17 from being over-etched.

The semiconductor substrate having the floating gates 5a is thermally oxidized to form a gate oxide layer 19 on the exposed active region. The common source line 17 and the floating gates 5a are also thermally oxidized during formation of the gate oxide layer 19. Thus, the gate oxide layer 19 is formed substantially even with the top surface of the floating gates 5a. Alternatively, the gate oxide layer 19 may be formed substantially even with the top surface of the common source line 17. A gate conductive layer 21 is formed on an entire surface of the semiconductor substrate where the gate oxide layer 19 is formed.

Referring to FIGS. 1, 6A, and 6B, the gate conductive layer 21 is anisotropically etched to form gate electrodes 21a on the vertical sidewalls of the spacers 11 and the top surface of the gate oxide layer 19. The gate electrodes 21a, as illustrated in FIG. 1, cross over the active region and act as word lines. Using the gate electrodes 21a, the spacers 11, and the common source line 17 as ion implantation masks, impurity ions are implanted into the active region to form drain regions 23. An interlayer dielectric layer (ILD) 25 is formed on an entire surface of the semiconductor substrate having the drain regions 23. The ILD 25 is patterned to form bit line contact holes 27 exposing the drain regions 23. Next, a bit line 29 is formed to cover the bit line contact holes 27, which are parallel with the active region.

The foregoing conventional nonvolatile memory cell is programmed by applying a ground voltage to the bit line 29, applying a program voltage to the common source line 17, and applying a voltage higher than a threshold voltage to the gate electrode 21a. In more detail, if a program voltage is applied to the common source line 17, an inversion layer, e.g., a first channel is formed at a surface of the semiconductor substrate 1 under the floating gate 5a. This is because a program voltage applied to the common source line 17 induces a sufficient voltage for forming the first channel to the floating gate 5a. Also, a second channel is formed at the surface of the semiconductor substrate 1 under the gate electrode 21a. Thus, a strong lateral electric field is formed between the first and second channels, and hot electrons are generated by the lateral electric field.

The hot electrons are injected into the floating gate 5a through the tunnel oxide layer 3. This operation is performed due to a vertical electric field, which is built by a voltage induced to the floating gate 5a. Here, the vertical electric field should be increased in order to improve program efficiency. The vertical electric field is proportional to a coupling ratio of the memory cell, and the coupling ratio has a direct relationship to an overlapped area between the common source line 17 and the floating gate 5a and/or an overlapped area between the source region 13 and the floating gate 5a. Thus, it is required to increase a lateral diffusion of the source region 13 or increase a thickness of the floating gate 5a in order to improve the program efficiency. However, when the thickness of the floating gate 5a is increased, as illustrated in FIG. 5A, the common source line 17 may be over-etched. In addition, if a lateral diffusion of the source region 13 is increased, a punch through phenomenon may occur during a read mode of the nonvolatile memory cell.

SUMMARY OF THE INVENTION

It is therefore a feature of the present invention to provide nonvolatile memory devices having a split gate structure and a spacer-shaped floating gate formed in a trench region as well as a common source line overlapped with a sidewall of the spacer-shaped floating gate.

It is another feature of the present invention to provide methods of fabricating nonvolatile memory cells, which can maximize a coupling ratio regardless of a junction depth of a source region and a thickness of a floating gate.

One aspect of the present invention provides nonvolatile memory cells having a split gate structure. The nonvolatile memory cell comprises a device isolation layer formed at a predetermined region of a semiconductor substrate to define an active region as well as a cell trench region formed in a portion of the active region.

It is preferable that the width of the cell trench region is identical to that of the active region. The cell trench region includes a pair of first sidewalls that face each other, a pair of second sidewalls that face each other, and a bottom surface. The first sidewalls are parallel to a direction that crosses the active region, and the second sidewalls are parallel to the active region.

Consequently, the second sidewalls may correspond to sidewalls of the device isolation layer. The first sidewalls are covered with insulated floating gates. A source region is disposed at the bottom surface of the cell trench region. A common source line is disposed in the cell trench region between the insulated floating gates. The common source line is insulated from the floating gates and electrically connected to the source region. Also, the common source line is extended along the direction that crosses the active region to pass through the device isolation layer.

Insulated word lines, which are parallel with the common source line, are disposed on the active regions that are adjacent to the floating gates. Drain regions are disposed at surfaces of the active regions, which is adjacent to the word lines. The drain regions are located on opposite sides of the common source line and are spaced at a substantially equal distance from the first sidewalls.

Further, an interlayer dielectric layer (ILD) covers the semiconductor substrate having the drain regions, the word lines and the common source line. The drain regions are exposed by bit line contact holes penetrating the ILD. A bit line, which is parallel with the active region, is disposed on the ILD. The bit line is electrically connected to the drain regions through the bit line contact holes.

The floating gates may have a spacer shape. Also, the floating gates are insulated from the first sidewalls and the bottom surface by a tunnel oxide layer. In addition, a sidewall insulation layer is interposed between the floating gates and the common source line.

A gate insulation layer is interposed between the word lines and the active regions. The word lines may be extended to cover the floating gates adjacent to the word lines.

Further, the nonvolatile memory cells may comprise an interlayer dielectric layer formed on an entire surface of the semiconductor substrate having the word lines, the device isolation layer, the common source line, and the drain regions, and a bit line electrically connected to the drain regions through bit line contact holes penetrating predetermined regions of the interlayer dielectric layer, wherein the bit line is disposed to be parallel with the active region.

According to another aspect of the present invention provides methods of fabricating nonvolatile memory cells having a split gate structure. The method comprises forming a device isolation layer at a predetermined region of a semiconductor substrate to define a plurality of parallel active regions. A portion of each of the active regions is selectively etched to form cell trench regions. The respective cell trench regions include a pair of first sidewalls parallel with the direction that crosses the active regions, a pair of second sidewalls parallel with the active regions, and a bottom surface. It is preferable that the width of the cell trench regions is substantially equal to that of the active regions. In this case, the second sidewalls may correspond to sidewalls of the device isolation layer.

Insulated floating gates are formed on the first sidewalls. The device isolation layer between the cell trench regions is selectively etched to form source line trench regions. Source regions are formed at the bottom surfaces of the cell trench regions. In the event that the semiconductor substrate is exposed during formation of the source line trench regions, the source regions may be formed even with the bottom surfaces of the source line trench regions in addition to the bottom surfaces of the cell trench regions. Thus, each of the source regions has a line shape that crosses the active regions.

Alternatively, the source regions may be selectively formed only at the bottom surfaces of the cell trench regions prior to formation of the source line trench regions.

A sidewall insulation layer is selectively formed on sidewalls of the floating gates. Common source lines are formed in the cell trench regions between the floating gates and the source line trench regions. Thus, the common source lines are formed to cross the active regions and electrically connected to the source regions. Also, the common source lines are electrically insulated from the floating gates by the sidewall insulation layer.

Insulated word lines, which are parallel with the common source lines, are formed on the active regions adjacent to the floating gates. The word lines are insulated from the active regions by a gate insulation layer. Drain regions are formed in the active regions adjacent to the word lines. The drain regions are located on opposite sides of the common source lines and are spaced at a substantially equal distance from the first sidewalls.

Also, the methods of fabricating nonvolatile memory cells having a split gate structure according to the present invention may further comprise forming an interlayer dielectric layer on an entire surface of the semiconductor substrate having the drain regions, patterning the interlayer dielectric layer to form bit line contact holes exposing the drain regions, and forming bit lines electrically connected to the drain regions through the bit line contact holes on the interlayer dielectric layer, each of the bit lines is formed over the respective active regions.

In addition, an interlayer dielectric layer (ILD) is formed on substantially an entire surface of the semiconductor substrate having the drain regions. The ILD is patterned to form bit line contact holes exposing the drain regions. Bit lines, which are parallel with the active regions, are formed on the interlayer insulation layer. The bit lines are electrically connected to the drain regions through the bit line contact holes.

Further, the method of fabricating nonvolatile memory cells wherein forming the cell trench regions comprises forming a first photoresist pattern having openings that crosses the active regions on the semiconductor substrate including the device isolation layer, etching the active regions exposed by the openings to a predetermined depth using the first photoresist pattern as an etch mask, and removing the first photoresist pattern. In addition, the predetermined depth of the active regions may be substantially equal to the thickness of the device isolation layer.

Still further, the forming of the insulated floating gates, the source line trench regions, and the source regions comprises thermally oxidizing the semiconductor substrate having the cell trench regions to form a tunnel oxide layer on the first sidewalls and the bottom surfaces, forming spacers covering the first and second sidewalls, forming a second photoresist pattern having openings that crosses the active regions on the semiconductor substrate having the spacers, the openings of the second photoresist pattern expose the spacers formed on the second sidewalls as well as the device isolation layer between the second sidewalls, selectively etching the exposed spacers using the second photoresist pattern as an etch mask to separate the spacers formed on the first sidewalls from each other, etching the exposed device isolation layer using the second photoresist pattern as an etch mask to form source line trench regions between the cell trench regions, implanting impurity ions using the second photoresist pattern as an ion implantation mask to form source regions at the bottom surfaces of the cell trench regions, and removing the second photoresist pattern.

Also, the etching process for forming the source line trench regions is performed until the semiconductor substrate is exposed, the source regions being formed even with the bottom surfaces of the source line trench regions in addition to the bottom surfaces of the cell trench regions to have a line shape which is parallel with the direction that crosses the active region.

The forming of the sidewall insulation layer comprises conformally forming an insulation layer on an entire surface of the semiconductor substrate having the source region, and anisotropically etching the insulation layer to form a sidewall insulation layer on the sidewalls of the floating gates and to expose the source regions.

The forming of the common source lines comprises forming a conductive layer filling the cell trench regions and the source line trench regions on an entire surface of the semiconductor substrate having the sidewall insulation layer, and planarizing the conductive layer until the device isolation layer and the active regions are exposed.

The forming of the insulated word lines comprises forming a gate insulation layer on an entire surface of the semiconductor substrate having the common source line, forming a gate conductive layer on the gate insulation layer, and patterning the gate conductive layer to form word lines covering the active regions adjacent to the floating gates and being parallel with the common source lines.

These foregoing and other objects, features and advantages of the invention will be apparent from the following more particular description of preferred embodiments of the invention, as illustrated in the accompanying drawings, wherein like reference members represent like parts of the invention.

DESCRIPTION OF PREFERRED EMBODIMENTS

Figure 1:
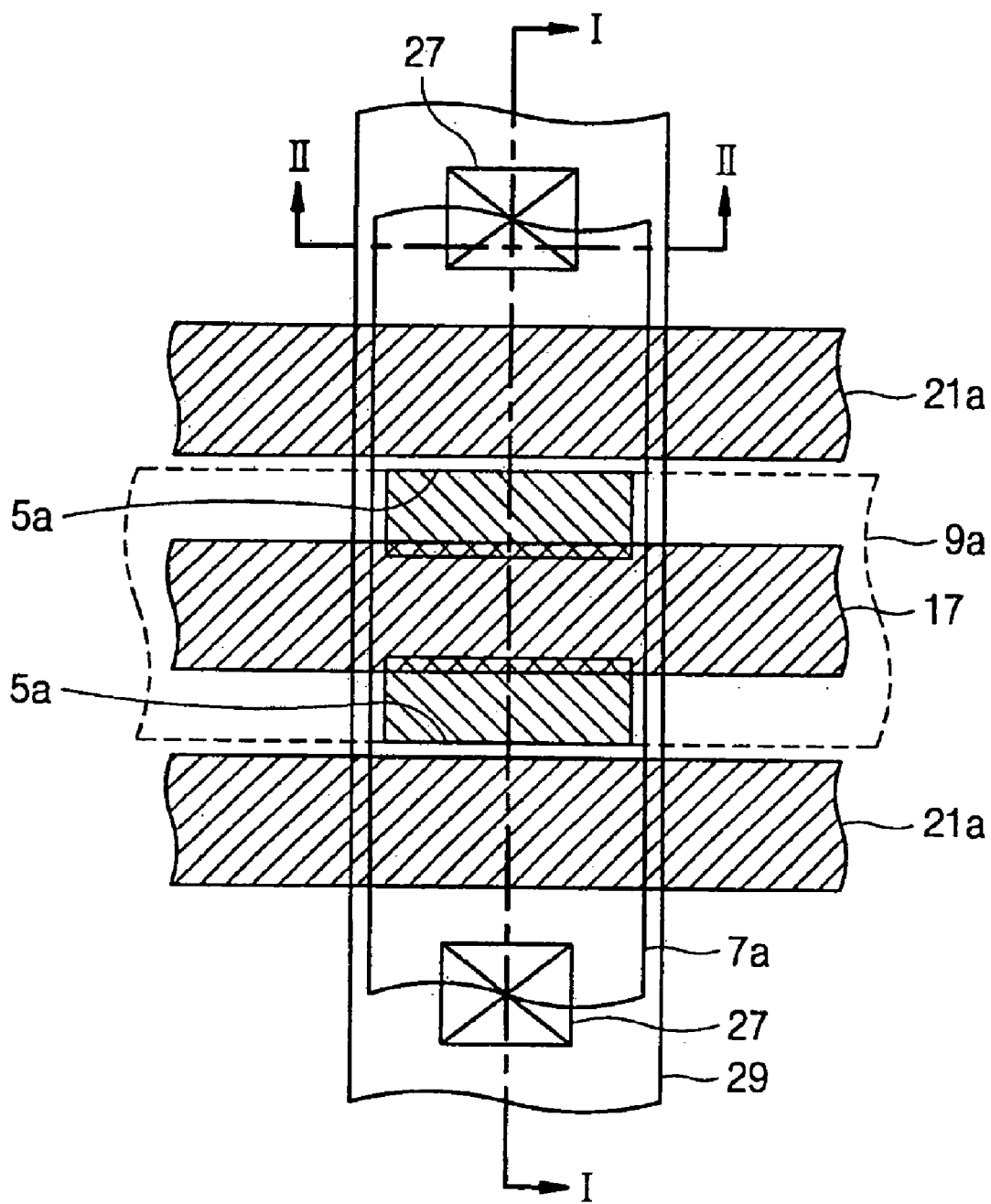
FIG. 1 is a top plan view of conventional nonvolatile memory cells.
Figure 2A:
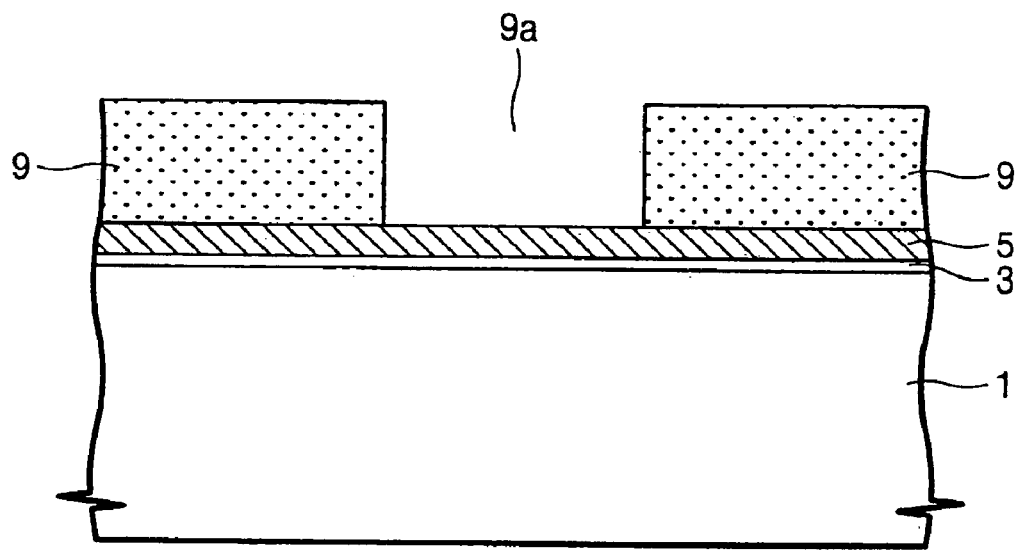
FIGS. 2A, 3, 4, 5A, and 6A are cross-sectional views taken along the line I—I of FIG. 1 for illustrating a method of fabricating the conventional nonvolatile memory cells.
Figure 2B:
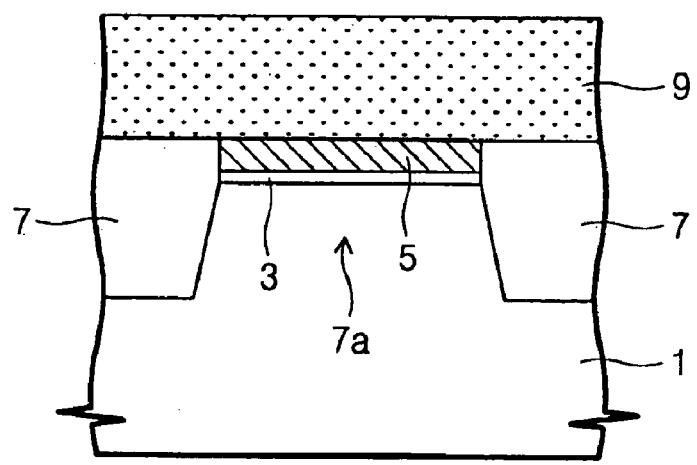
FIGS. 2B, 5B, and 6B are cross-sectional views taken along the line II—II of FIG. 1 for illustrating the method of fabricating the conventional nonvolatile memory cells.
Figure 3:
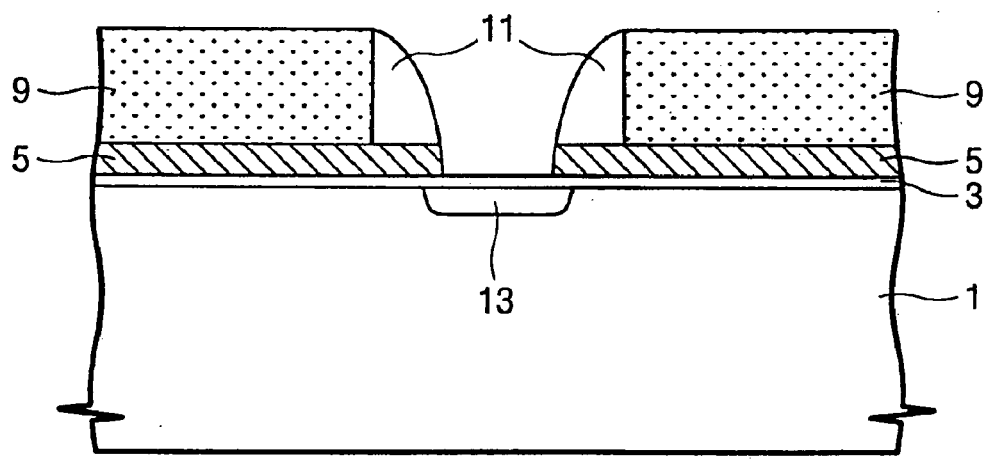
Figure 4:
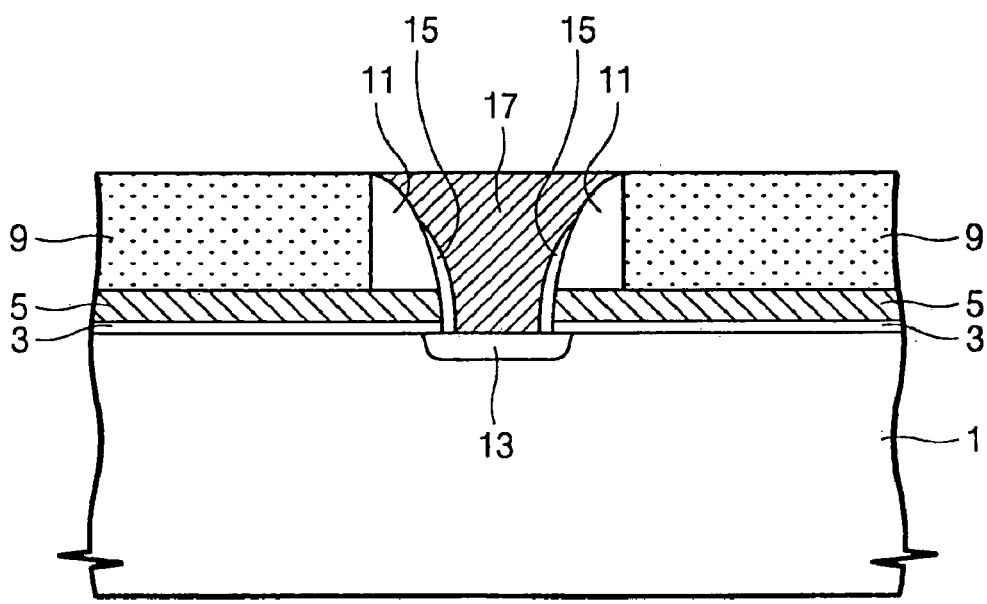
Figure 5A:
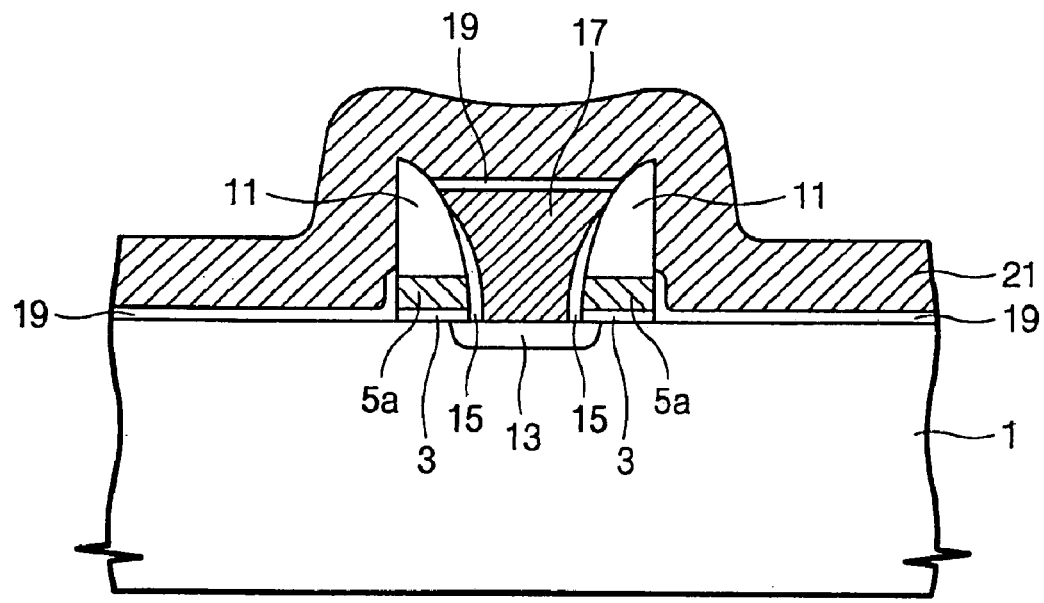
Figure 5B:
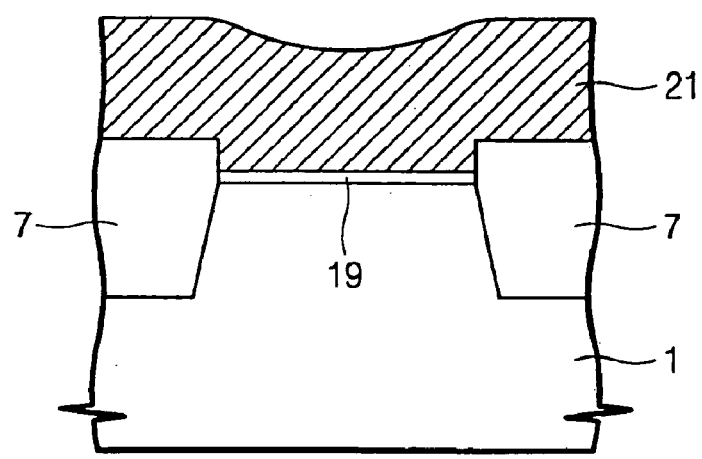
Figure 6A:
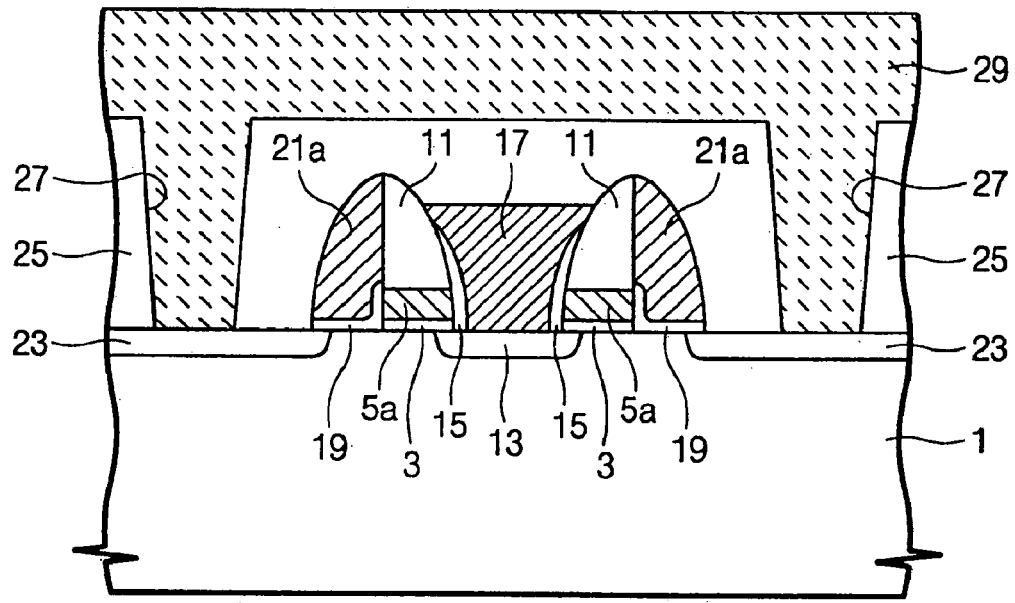
Figure 6B:
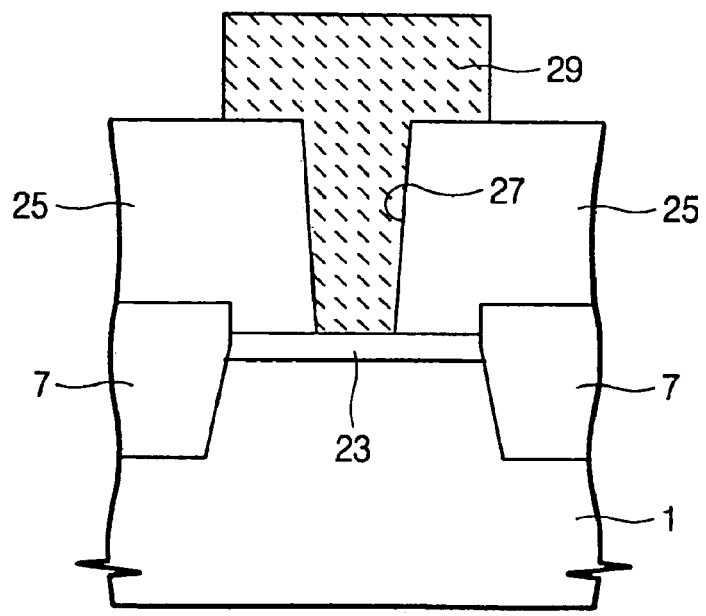

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 7:
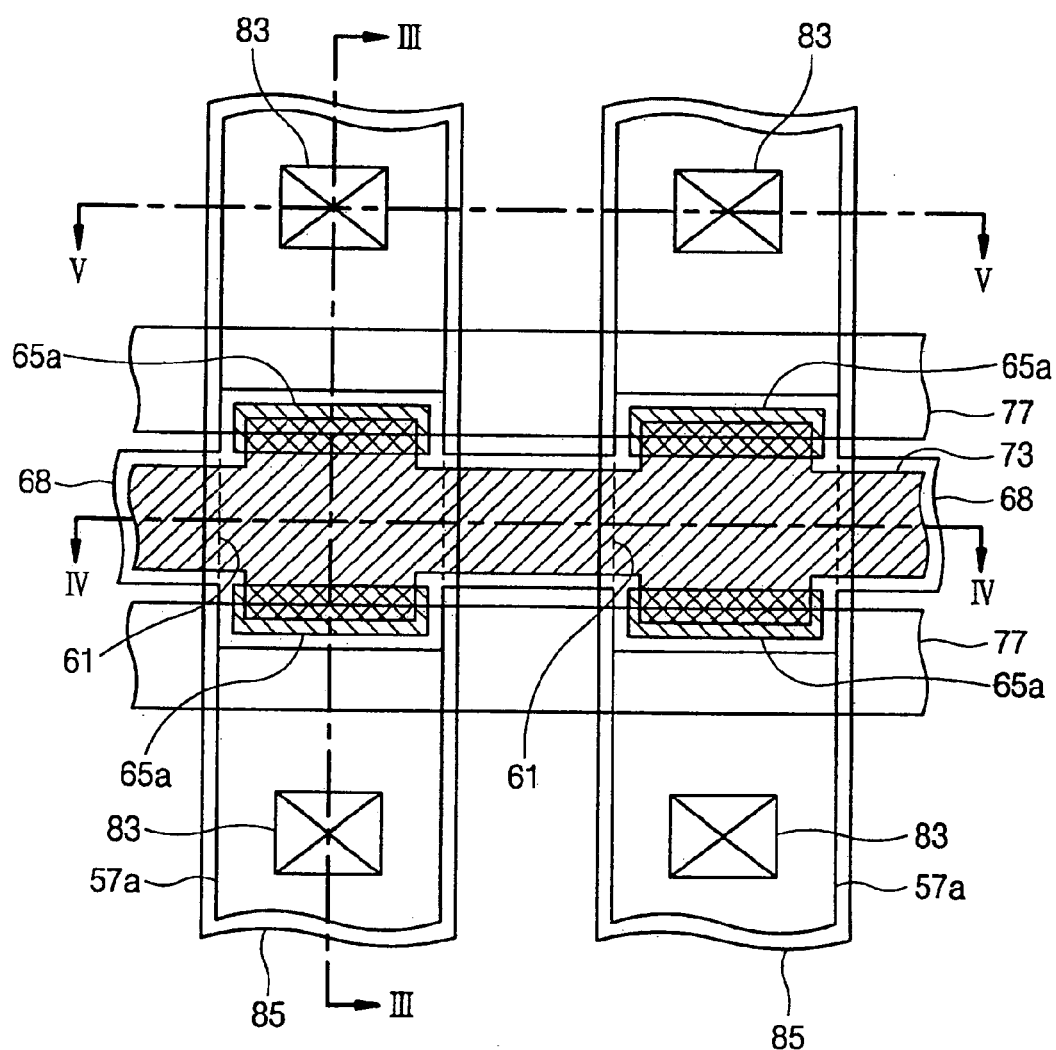
FIG. 7 is a top plan view of nonvolatile memory cells in accordance with a preferred embodiment of the present invention.

FIG. 7 is a top plan view of nonvolatile memory cells in accordance with a preferred embodiment of the present invention. FIGS. 8A, 9A, 10A, 11A, 12A, 13A, and 14A are cross-sectional views taken along the line III—III of FIG. 7. FIGS. 8B, 9B, 10B, 11B, 12B, 13B, and 14B are cross-sectional views taken along the line IV—IV of FIG. 7. FIGS. 9C, 10C, 11C, 12C, 13C, and 14C are cross-sectional views taken along the line V—V of FIG. 7.

Referring to FIGS. 7, 14A, 14B, and 14C, a device isolation layer 57 is disposed at a predetermined region of a semiconductor substrate 51 to define active regions 57a that are parallel with each other. The device isolation layer 57 may be formed using a conventional trench isolation technique. Cell trench regions 61 are located in each of the active regions 57a. The cell trench regions 61 are arranged along the direction that crosses the active regions 57a.

Figure 9A:
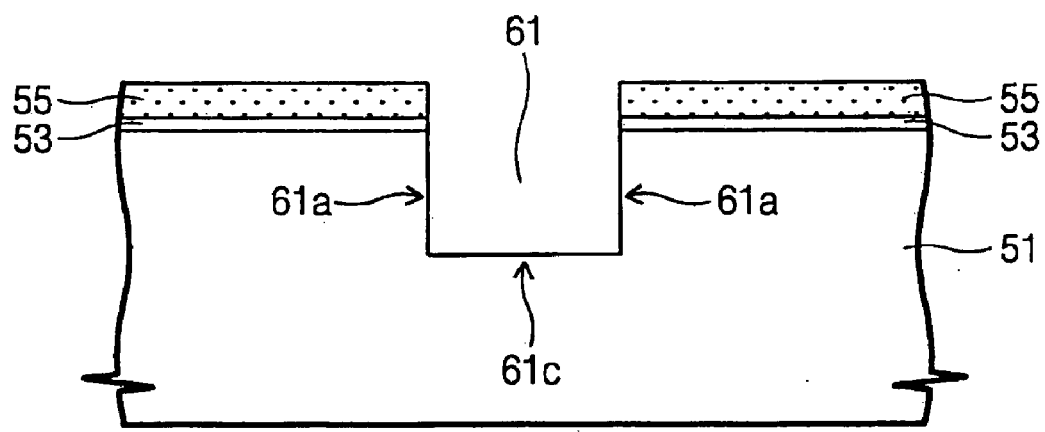
Figure 9B:
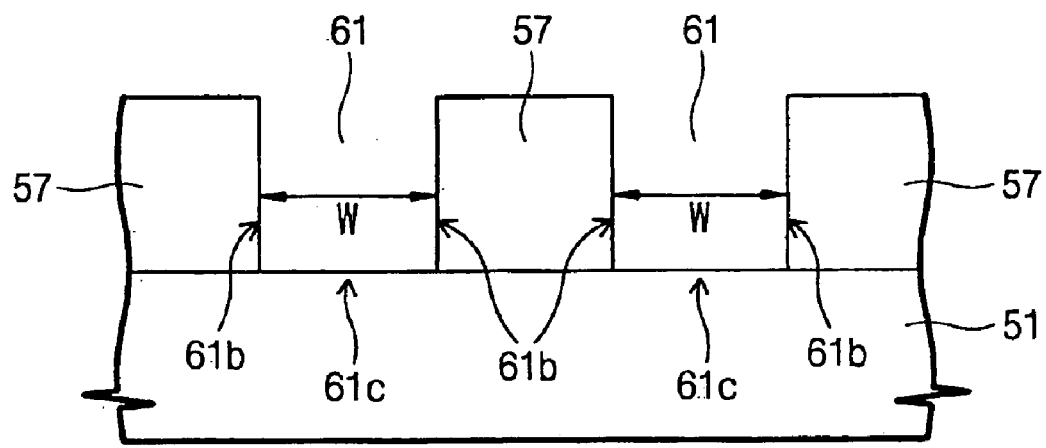

Each of the cell trench regions 61 includes a pair of first sidewalls 61a parallel with the direction of crossing the active regions 57a, a pair of second sidewalls (Item 61b as shown in FIG. 9B) parallel with the active regions 57a, and a bottom surface 61c. It is preferable that the width (Item W as shown in FIG. 9B) of the respective cell trench regions 61 is substantially equal to that of the active regions 57a. In this case, the second sidewalls 61b correspond to sidewalls of the device isolation layer 57, as shown in FIG. 9B.

Figure 14A:
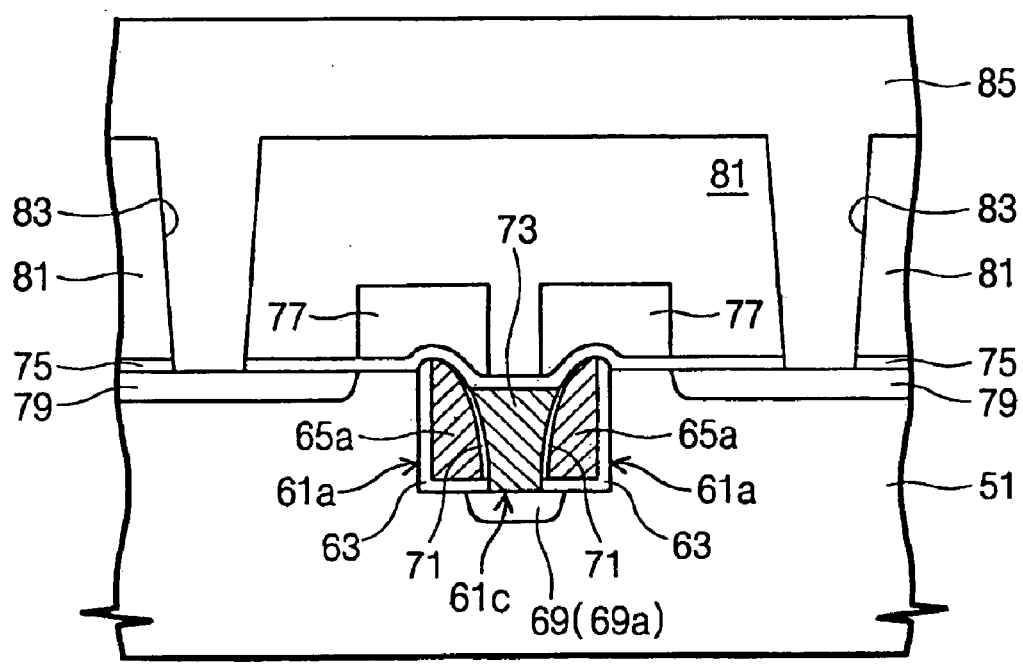
Figure 14B:
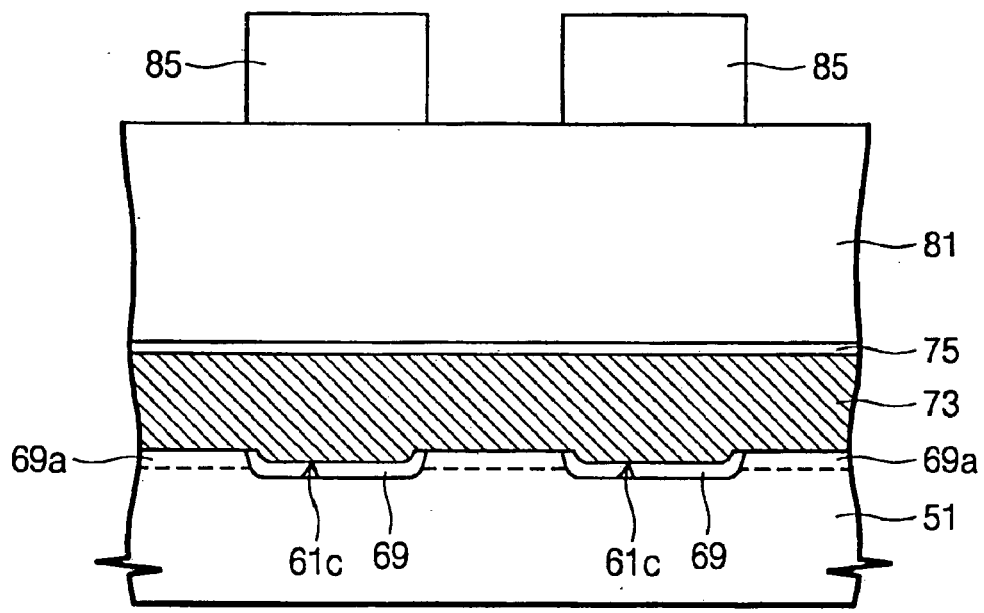
Figure 14C:
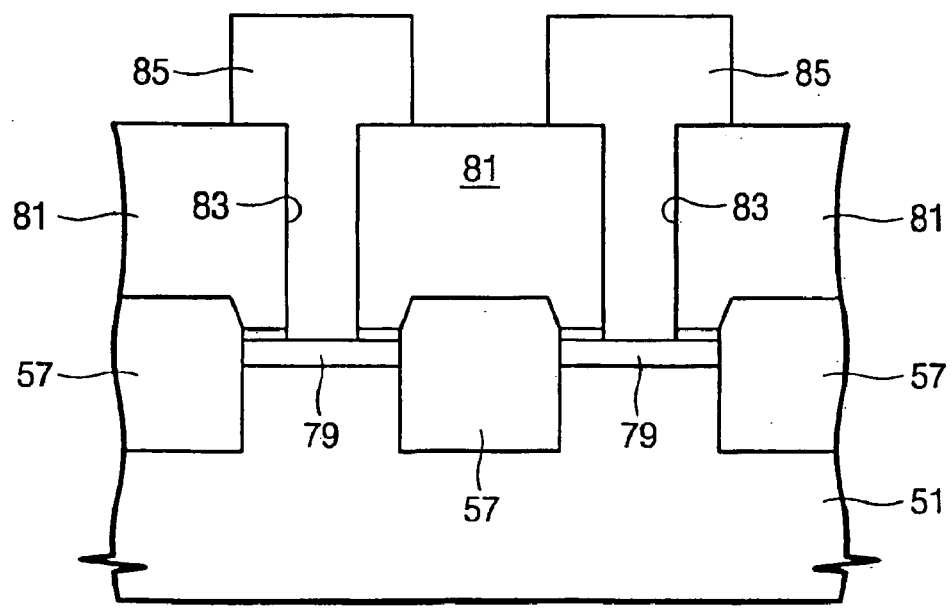

The first sidewalls 61a are covered with insulated floating gates 65a. The floating gates 65a may have a spacer shape as illustrated in FIG. 14A. The floating gates 65a are insulated from the first sidewalls 61a and the bottom surface 61c by a tunnel oxide layer 63. Sidewalls of the floating gates 65a are covered with a sidewall insulation layer 71. The device isolation layer 57 between the cell trench regions 61 is selectively etched to form source line trench regions 68. Thus, the cell trench regions 61 and the source line trench regions 68 therebetween constitute a groove crossing the active regions. Source regions 69 are disposed at the bottom surfaces of the cell trench regions 61. On the other hand, the source regions 69 may be extended along the direction that crosses the active regions 57a, thereby constituting a line-shaped source region 69a. In this case, the source region 69a is disposed substantially even with the bottom surfaces of the source line trench regions 68 and the bottom surfaces 61c of the cell trench region 61.

The cell trench regions 61 between the floating gates 65a and the source line trench regions 68 are connected by a common source line 73. The common source line 73 is electrically connected to the source regions 69 or 69a and insulated from the floating gates 65a by the sidewall insulation layer 71, as illustrated in FIG. 14A. Thus, if the depth of the cell trench regions 61 increases, an overlapped area between the common source line 73 and the floating gates 65a may be increased.

Insulated word lines 77 are disposed on the active regions 57a, which are adjacent to the floating gates 65a. In other words, the active regions 57a, which are adjacent to the first sidewalls 61a, are covered with the insulated word lines 77. The word lines 77 are extended to run parallel with the common source line 73. The word lines 77 are insulated from the active regions 57a by a gate insulation layer 75. Also, the word lines 77 may be extended to cover the floating gates 65a, which are adjacent to the word lines 77. In this case, the gate insulation layer 75 is intervened between the word lines 77 and the floating gates 65a.

Drain regions 79 are disposed in the active regions 57a, which are adjacent to the word lines 77. The drain regions 79 are located on opposite sides of the common source line 73 and are spaced apart from the first sidewalls 61a at a substantially equal distance from each of the first sidewalls 61a. The semiconductor substrate having the word lines 77, the common source line 73, and drain regions 79 are covered with an interlayer dielectric layer (ILD) 81. The drain regions 79 are exposed by bit line contact holes 83 penetrating the ILD 81. Bit lines 85, which are parallel with the active regions 57a, are disposed on the ILD 81. The bit lines 85 are electrically connected to the drain regions 79 through the bit line contact holes 83.

According to the present invention as described above, by increasing the depth of the cell trench regions 61, the coupling ratio of the cell may also be increased regardless of a lateral diffusion of the source regions 69.

Hereinafter, a method of fabricating the nonvolatile memory cells in accordance with a preferred embodiment of the present invention will be described.

Figure 8A:
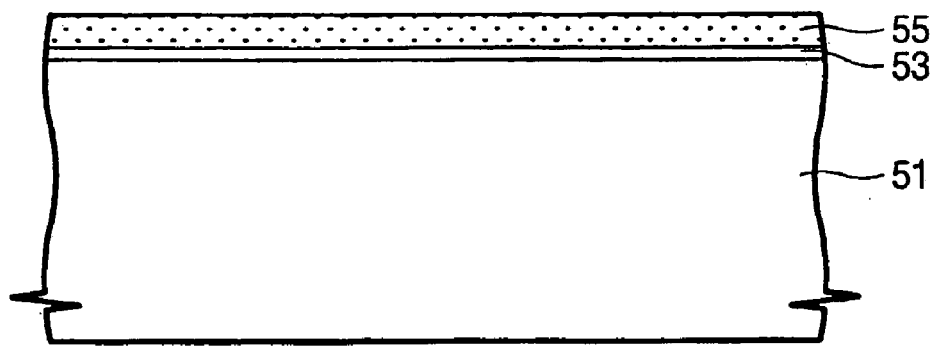
FIGS. 8A, 9A, 10A, 11A, 12A, 13A, and 14A are cross-sectional views taken along the line III—III of FIG. 7 for illustrating a method of fabricating the nonvolatile memory cells.
Figure 8B:
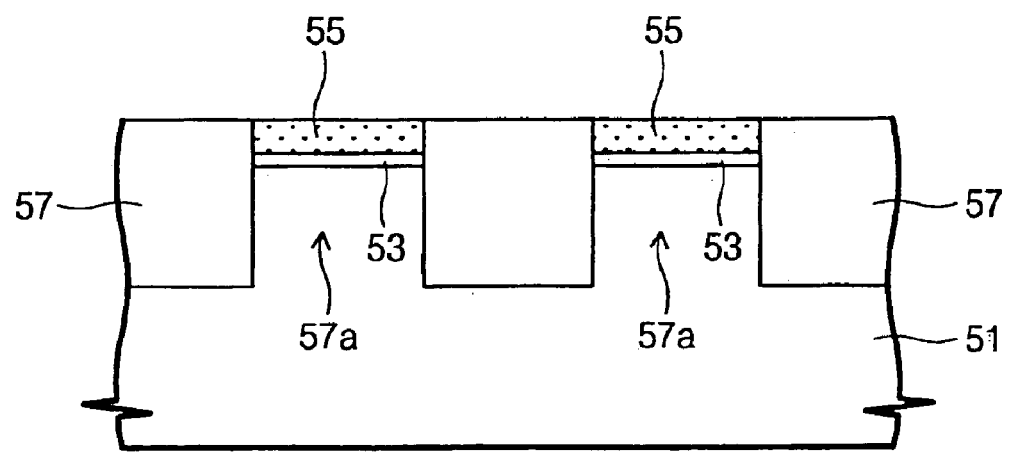
FIGS. 8B, 9B, 10B, 11B, 12B, 13B, and 14B are cross-sectional views taken along the line IV—IV of FIG. 7 for illustrating the method of fabricating the nonvolatile memory cells.

Referring to FIGS. 7, 8A, and 8B, a pad oxide layer 53 and a pad nitride layer 55 are sequentially formed on a semiconductor substrate 51. The pad nitride layer 55 and the pad oxide layer 53 are patterned to expose a predetermined region of the semiconductor substrate 51. The exposed semiconductor substrate 51 is etched using the patterned pad nitride layer 55 as an etch mask, to form an isolation trench region. An insulation layer is formed on the patterned pad nitride layer 55 and in the isolation trench region. The insulation layer may be a silicon oxide layer. The insulation layer is planarized until the patterned pad nitride layer 55 is exposed, thereby forming a device isolation layer 57 in the isolation trench region. The process of planarizing the insulation layer may be performed using a chemical mechanical polishing (CMP). Thus, the active regions 57a are parallel with each other and are defined at the semiconductor substrate 51. Here, the cross-sectional view taken along the line V—V of FIG. 7 has the same configuration as that of FIG. 8B.

Referring to FIGS. 7, 9A, 9B, and 9C, the patterned pad nitride layer 55 is removed using phosphoric acid ($H_3PO_4$). A first photoresist pattern 59 is formed on the semiconductor substrate where the patterned pad nitride layer 55 is removed. The first photoresist pattern 59 has an opening that crosses over the active regions 57a. The opening exposes predetermined regions of the patterned pad oxide layer 53 and the device isolation layer 57 therebetween. Using the first photoresist pattern 59 as an etch mask, the exposed pad oxide layer 53 and the semiconductor substrate 51 are successively etched to form cell trench regions 61 in the active regions 57a.

It is preferable that the depth of the cell trench regions 61 is identical to the thickness of the device isolation layer 57. Each of the cell trench regions 61 includes a pair of first sidewalls 61a, a pair of second sidewalls 61b, and a bottom surface 61c. The first sidewalls 61a are parallel with the direction that crosses the active regions 57a, and the second sidewalls 61b are parallel with the active regions 57a. Consequently, a width W of the cell trench regions 61 is consistent with that of the active regions 57a. Thus, the second sidewalls 61b correspond to sidewalls of the device isolation layer 57.

Figure 9C:
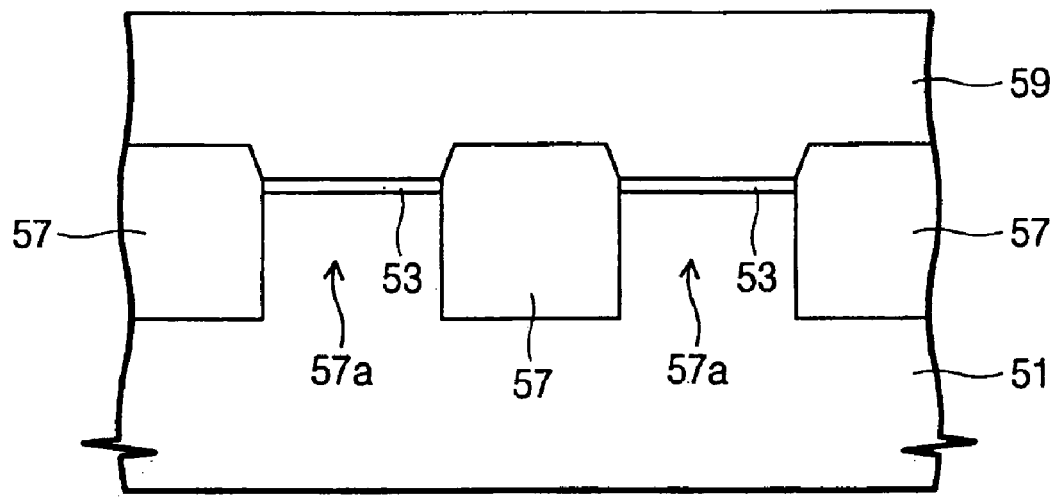
FIGS. 9C, 10C, 11C, 12C, 13C, and 14C are cross-sectional views taken along the line V—V of FIG. 7 for illustrating the method of fabricating the nonvolatile memory cells.

Referring to FIGS. 7, 10A, 10B, and 10C, the first photoresist pattern 59, as shown in FIG. 9C, is removed. Once the first photoresist pattern 59 is removed, the semiconductor substrate is then thermally oxidized to form a tunnel oxide layer 63 on the sidewalls 61a and 61b and the bottom surface 61c of the cell trench regions 61. According to this embodiment, a thermal oxide layer is not grown over the second sidewalls 61b, since the second sidewalls 61b correspond to the sidewalls of the device isolation layer 57.

Thus, the tunnel oxide layer 63 is formed only on the first sidewalls 61a and the bottom surface 61c. A conductive layer is conformally formed on an entire surface of the semiconductor substrate having the tunnel oxide layer 63. The conductive layer is preferably formed of a doped polysilicon layer.

The conductive layer is anisotropically etched to form spacers 65 on the first and second sidewalls 61a and 61b, exposing the patterned pad oxide layer 53 and the device isolation layer 57. In addition, the tunnel oxide layer 63 on the bottom surfaces 61c of the cell trench regions 61 is also exposed. It is readily apparent to one skilled in the art that the height of the spacers 65 is determined by the depth of the cell trench regions 61 rather than the thickness of the conductive layer, e.g., the doped polysilicon layer.

A second photoresist pattern 67 is formed on the semiconductor substrate having the spacers 65. The second photoresist pattern 67 has a slit-shaped opening that crosses the active regions 57a. The opening of the second photoresist pattern 67 has a narrower width than that of the first photoresist pattern 59. More specifically, the opening of the second photoresist pattern 67 exposes the spacers 65 on the second sidewalls 61b as well as the device isolation layer 57 therebetween. Also, the opening of the second photoresist pattern 67 exposes the tunnel oxide layer 63 formed on the bottom surfaces 61c of the cell trench regions 61. On the contrary, the spacers 65 formed on the first sidewalls 61a and the active regions 57a are covered with the second photoresist pattern 67.

Figure 10A:
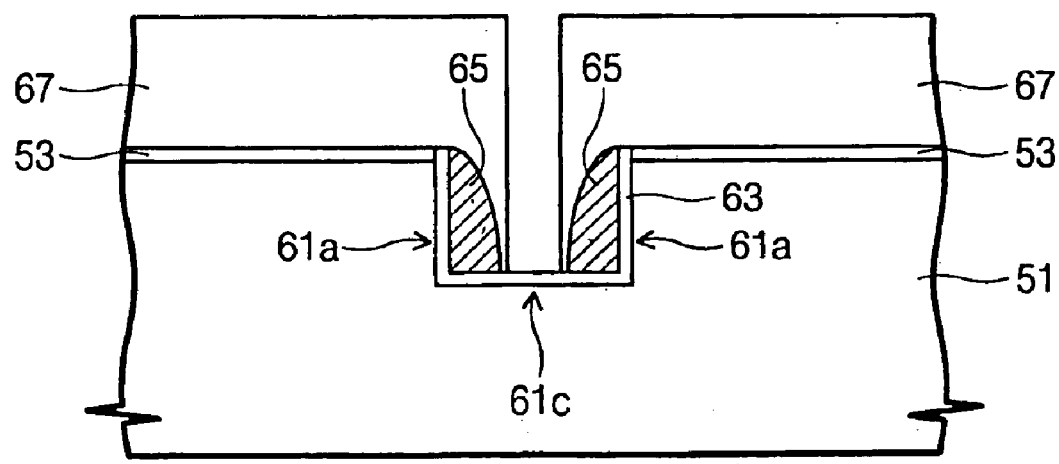
Figure 10B:
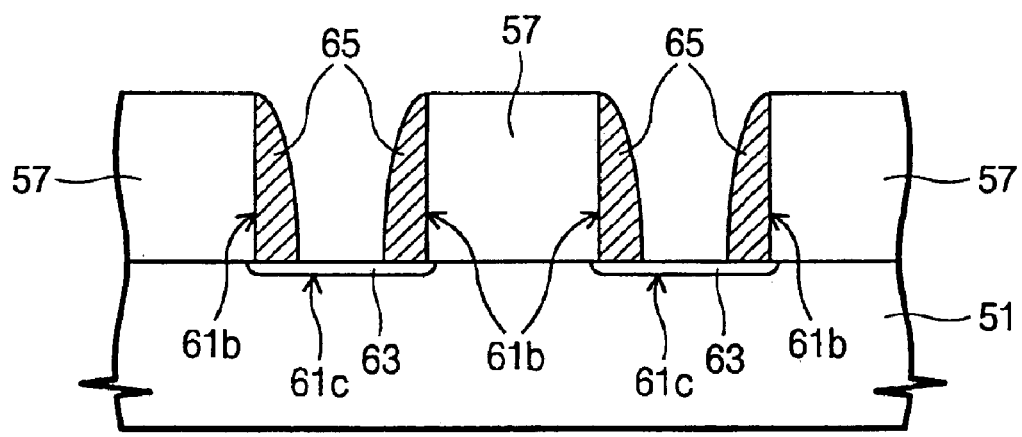
Figure 10C:
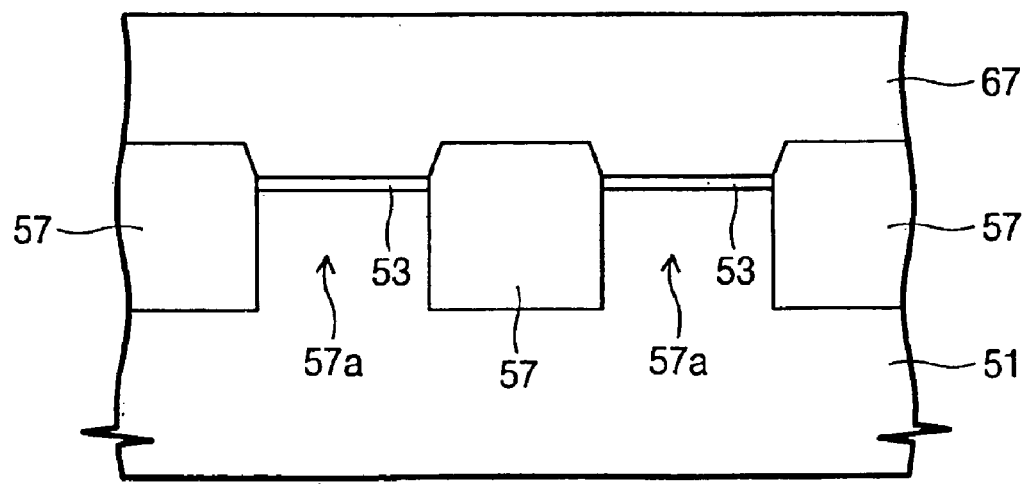
Figure 11A:
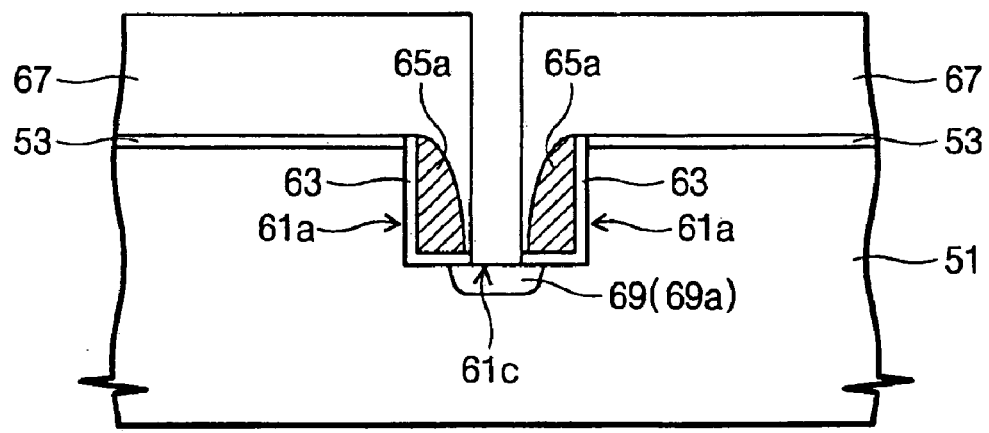
Figure 11B:
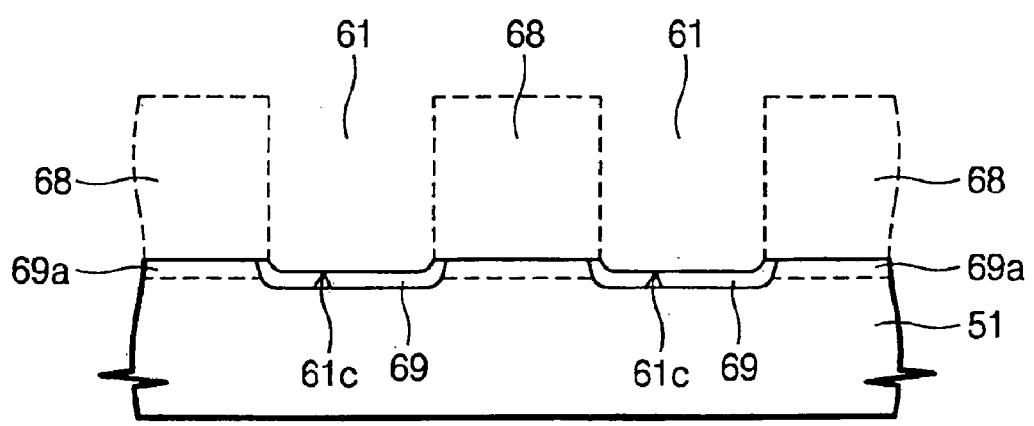
Figure 11C:
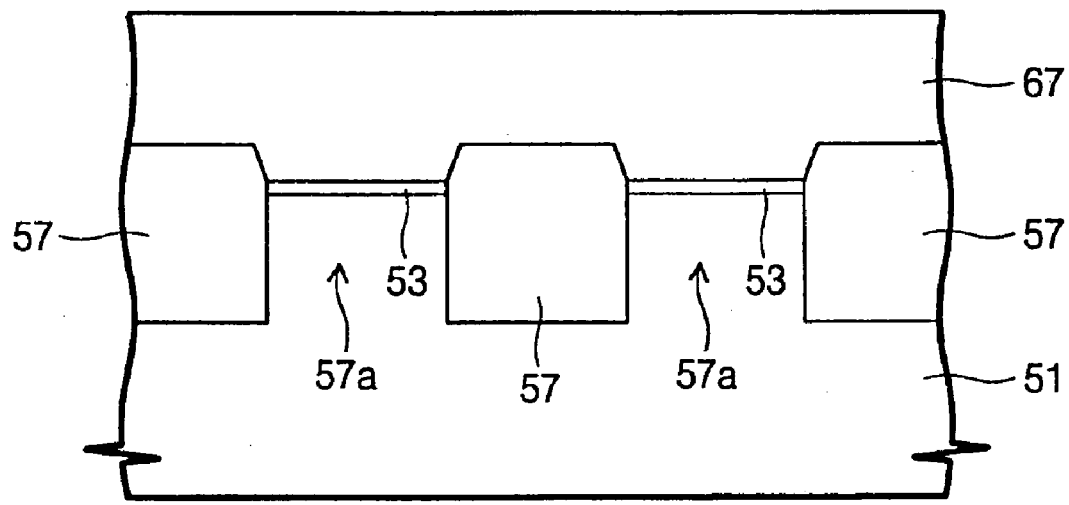

Referring to FIGS. 7, 11A, 11B, and 11C, the spacers 65 formed on the second sidewalls 61b, as shown in FIG. 10B, are selectively etched using the second photoresist pattern 67 as an etch mask. Thus, separated floating gates 65a are formed on the first sidewalls 61a.

Using the second photoresist pattern 67 and the device isolation layer 57 as ion implantation masks, impurity ions are implanted into the bottom surfaces 61 of the cell trench regions 61 to form source regions 69.

The exposed device isolation layer 57 is then etched using the second photoresist pattern 67 as an etch mask, to form source line trench regions 68. Thus, a groove is formed across the active regions 57a. While the exposed device isolation layer 57 is etched, the exposed tunnel oxide layer 63 may be removed. The groove includes the cell trench regions 61 and the source line trench regions 68 therebetween. It is preferable that the source line trench regions 68 are formed by etching the device isolation layer 57 until the semiconductor substrate 51 is exposed. Alternatively, the source line trench regions 68 may be formed to a depth, which is smaller than a thickness of the device isolation layer 57. In this case, a portion of the device isolation layer 57 exists under the source line trench regions 68.

Meanwhile, the ion implantation process for forming the source regions 69 may be implemented after forming the source line trench regions 68. In this case, impurity ions may be implanted into the semiconductor substrate 51 under the source line trench regions 68 as well as the bottom surfaces 61c of the cell trench regions 61.

Thus, a line-shaped source region 69a may be formed along the direction that crosses the active regions 57a.

Referring to FIGS. 7, 12A, 12B, and 12C, the second photoresist pattern 67 is removed. After the second photoresist pattern 67 is removed, an insulation layer is conformally formed on an entire surface of the semiconductor substrate. The insulation layer may be a silicon oxide layer or a silicon nitride layer. The insulation layer is anisotropically etched to form a sidewall insulation layer 71 covering the sidewalls of the floating gates 65a and to concurrently expose the source regions 69 or 69a. A conductive layer, which fills the groove, is formed on an entire surface of the semiconductor substrate having the sidewall insulation layer 71. The conductive layer may be formed of a doped polysilicon layer or a metal layer.

The conductive layer is planarized until the pad oxide layer 53 existing on the active regions 57a and the device isolation layer 57 are exposed, thereby forming a common source line 73 in the groove.

The planarization process of the conductive layer may be performed using an etch-back technique or a chemical mechanical polishing technique. As a result, the common source line 73 has a line shape that crosses the active regions 57a and is electrically connected to the source regions 69 or 69a. Also, the common source line 73 is insulated from the floating gates 65a by the sidewall insulation layer 71.

Figure 12A:
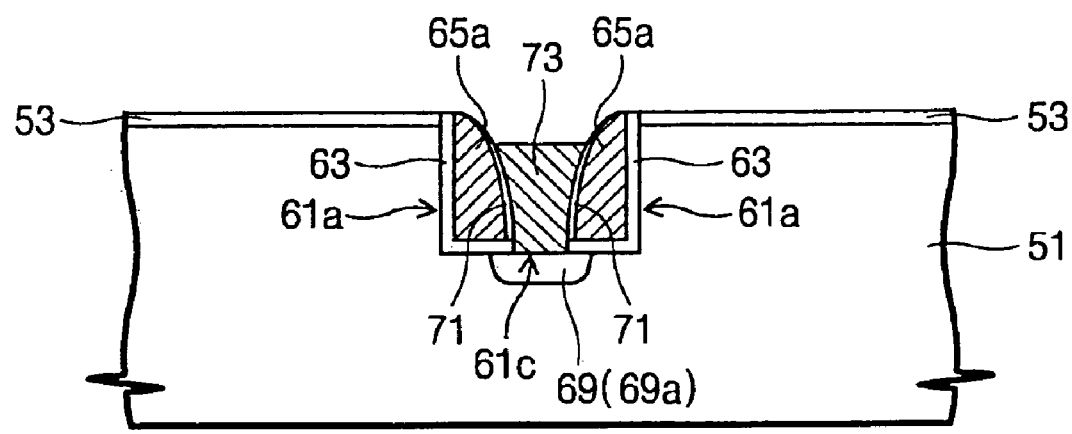
Figure 12B:
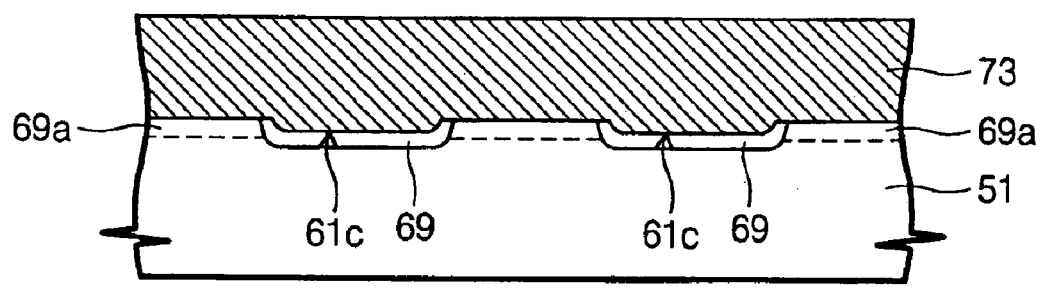
Figure 12C:
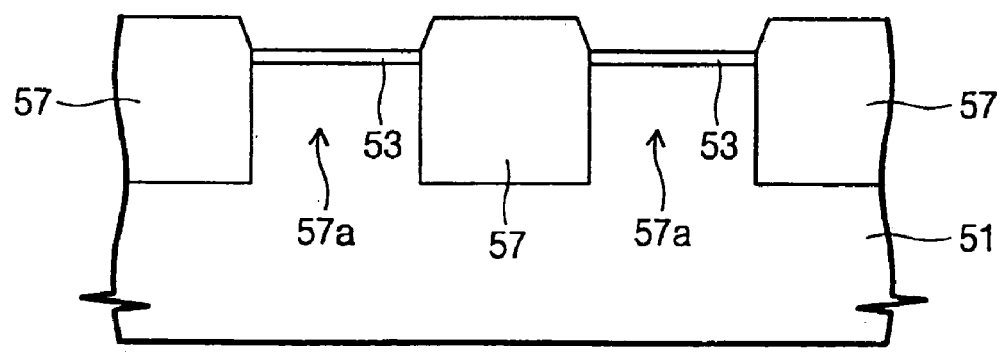

As illustrated in FIG. 12A, if a depth of the cell trench regions 61 increases, the height of the floating gates 65a also increases. Thus, an overlapped area between the common source line 73 and the floating gates 65a may be substantially increased as compared with conventional methods. Consequently, the coupling ratio of a cell can be maximized regardless of the thickness of the conductive layer for forming the floating gates 65a as well as a lateral diffusion of the source regions 69.

Referring to FIGS. 7, 13A, 13B, and 13C, the pad oxide layer 53 existing on the active regions 57a is removed to expose surfaces of the active regions 57a. Once the pad oxide layer 53 is removed, a gate insulation layer 75 is then formed on an entire surface of the semiconductor substrate. The gate insulation layer 75 may be formed of an insulation layer using techniques such as thermal oxidation or CVD. In the event that the common source line is formed of a metal layer, the gate insulation layer 75 is preferably formed by using CVD.

Figure 13A:
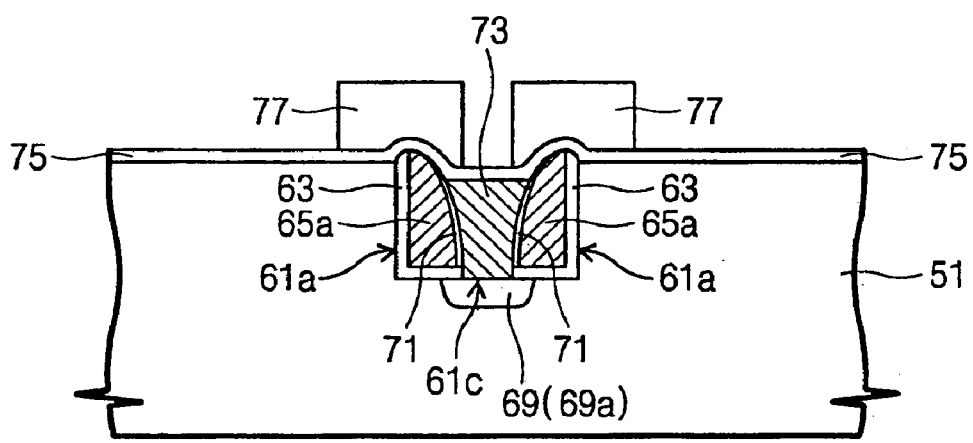
Figure 13B:
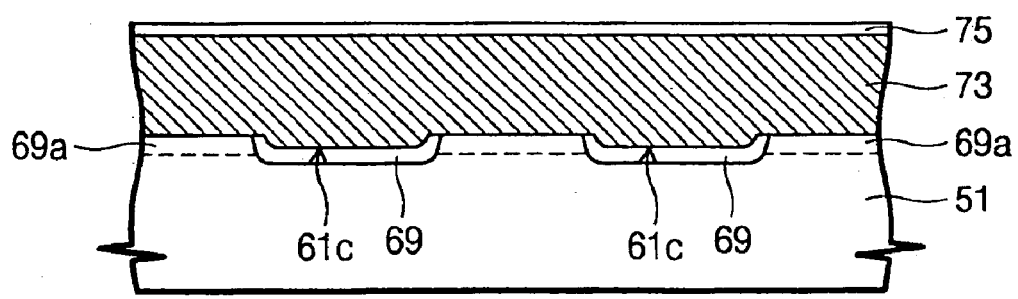
Figure 13C:
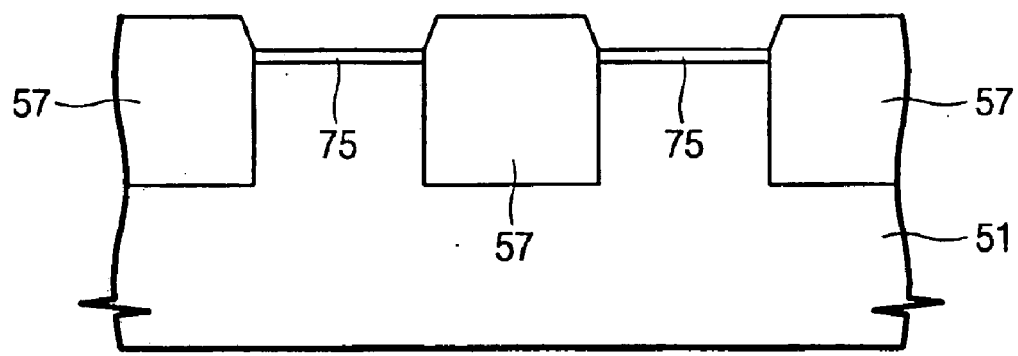

A gate conductive layer is formed on the gate insulation layer 75. The gate conductive layer is patterned to form insulated word lines 77 covering the active regions 57a, which are adjacent to the floating gates 65a. In other words, the word lines 77 cover the active regions 57a, which are adjacent to the first sidewalls 65a. Also, the word lines 77 are formed to run parallel with the common source line 73. In addition, the word lines 77 may be formed to cover the floating gates 65a as illustrated in FIG. 13A.

Referring to FIGS. 7, 14A, 14B, and 14C, impurity ions are implanted into the active regions 57a using the word lines 77 as ion implantation masks, to form drain regions 79. As a result, the drain regions 79 are formed on opposite sides of the common source line 73 and are spaced apart from the first sidewalls 65a at a substantial equal distance. An interlayer dielectric layer (ILD; 81) is formed on an entire surface of the semiconductor substrate having the drain regions 79. The ILD 81 is patterned to form bit line contact holes 83 exposing the drain regions 79. In case that the gate insulation layer 75 exists on the drain regions 79, the ILD 81 and the gate insulation layer 75 are successively patterned to form the bit line contact holes 83.

A bit line conductive layer, which fills the bit line contact holes 83, is formed on an entire surface of the semiconductor substrate having the bit line contact holes 83. The bit line conductive layer is preferably formed of a metal layer such as a tungsten layer, an aluminum layer, or a copper layer. The bit line conductive layer is patterned to form bit lines 85, which are parallel with the active regions 57a. The bit lines 85 are electrically connected to the drain regions 79 through the bit line contact holes 83.

According to preferred embodiments of the present invention as described above, a portion of an active region is etched to form a cell trench region, and spacer-shaped floating gates are formed on sidewalls of the cell trench region. Also, an insulated common source line is formed in a gap region between the floating gates. Thus, an overlapped area between the common source line and the floating gates can be maximized. Further, in case that a program voltage is applied to the common source line, a voltage induced to the floating gates may be maximized to improve program efficiency.

The foregoing embodiments are merely examplary and are not to be construed as limiting the present invention. It will be understood by those of ordinary skill in the art that various alternatives, modifications, variations, and changes may be made in the preferred embodiments of the present invention without departing from its true spirit. The description of the present invention is intended to be illustrative, and not to limit the scope of the claims.

What is claimed is:

1. A method of fabricating nonvolatile memory cells comprising:

forming a device isolation layer at a predetermined region of a semiconductor substrate to define a plurality of parallel active regions;

selectively etching a portion of each of the active regions to form cell trench regions, the respective cell trench regions including a pair of first sidewalls being parallel with the direction that crosses the active regions, a pair of second sidewalls being parallel with the active regions, and a bottom surface;

forming insulated floating gates on the first sidewalls;

selectively etching the device isolation layer between the cell trench region to form source line trench regions between the cell trench regions;

forming source regions at the bottom surfaces of the cell trench regions;

forming a sidewall insulation layer on sidewalls of the floating gates;

forming common source lines in the cell trench regions between the floating gates and in the source line trench regions, the common source lines being electrically connected to the source regions and crossing the active regions;

forming insulated word lines covering the active regions adjacent to the floating gates and being parallel with the common source lines; and forming drain regions in the active regions adjacent to the word lines, the drain regions being located opposite the common source lines.

2. The method as claimed in claim 1, wherein forming the cell trench regions comprises:

forming a first photoresist pattern having openings that crosses the active regions on the semiconductor substrate including the device isolation layer;

etching the active regions exposed by the openings to a predetermined depth using the first photoresist pattern as an etch mask; and removing the first photoresist pattern.

3. The method as claimed in claim 2, wherein the predetermined depth is equal to a thickness of the device isolation layer.

4. The method as claimed in claim 1, wherein forming the insulated floating gates, the source line trench regions, and the source regions comprises:

thermally oxidizing the semiconductor substrate having the cell trench regions to form a tunnel oxide layer on the first sidewalls and the bottom surfaces;

forming spacers covering the first and second sidewalls;

forming a second photoresist pattern having openings that crosses the active regions on the semiconductor substrate having the spacers, the openings of the second photoresist pattern expose the spacers formed on the second sidewalls as well as the device isolation layer between the second sidewalls;

selectively etching the exposed spacers using the second photoresist pattern as an etch mask to separate the spacers formed on the first sidewalls from each other;

etching the exposed device isolation layer using the second photoresist pattern as an etch mask to form source line trench regions between the cell trench regions;

implanting impurity ions using the second photoresist pattern as an ion implantation mask to form source regions at the bottom surfaces of the cell trench regions; and removing the second photoresist pattern.

5. The method as claimed in claim 4, wherein the etching process for forming the source line trench regions is performed until the semiconductor substrate is exposed, the source regions being formed even at the bottom surfaces of the source line trench regions in addition to the bottom surfaces of the cell trench regions to have a line shape which is parallel with the direction that crosses the active region.

6. The method as claimed in claim 1, wherein forming the insulated floating gates, the source line trench regions, and the source regions comprises:

thermally oxidizing the semiconductor substrate having the cell trench region to form a tunnel oxide layer on the first sidewalls and the bottom;

forming spacers on the first and second sidewalls;

forming a second photoresist pattern having openings that crosses the active regions on the semiconductor substrate having the spacers, the openings of the second photoresist pattern expose the spacers formed on the second sidewalls as well as the device isolation layer between the second sidewalls;

selectively etching the exposed spacers using the second photoresist pattern as an etch mask, to separate the spacers formed on the first sidewalls from each other;

implanting impurity ions using the second photoresist pattern and the exposed device isolation layer as ion implantation masks, to form source regions at the bottom surfaces of the cell trench regions;

etching the exposed device isolation layer using the second photoresist pattern as an etch mask to form source line trench regions between the cell trench regions; and removing the second photoresist pattern.

7. The method as claimed in claim 1, wherein forming the sidewall insulation layer comprises:

conformally forming an insulation layer on an entire surface of the semiconductor substrate having the source region, and anisotropically etching the insulation layer to form a sidewall insulation layer on the sidewalls of the floating gates and to expose the source regions.

8. The method as claimed in claim 1, wherein forming the common source lines comprises:

forming a conductive layer filling the cell trench regions and the source line trench regions on an entire surface of the semiconductor substrate having the sidewall insulation layer; and planarizing the conductive layer until the device isolation layer and the active regions are exposed.

9. The method as claimed in claim 1, wherein forming the insulated word lines comprises:

forming a gate insulation layer on an entire surface of the semiconductor substrate having the common source line;

forming a gate conductive layer on the gate insulation layer; and patterning the gate conductive layer to form word lines covering the active regions adjacent to the floating gates and being parallel with the common source lines.

10. The method as claimed in claim 1, further comprising:

forming an interlayer dielectric layer on an entire surface of the semiconductor substrate having the drain regions;

patterning the interlayer dielectric layer to form bit line contact holes exposing the drain regions; and forming bit lines electrically connected to the drain regions through the bit line contact holes on the interlayer dielectric layer, each of the bit lines is formed over the respective active regions.

* * * * *